United States Patent
Kulah et al.

(10) Patent No.: US 7,579,757 B2
(45) Date of Patent: Aug. 25, 2009

(54) METHOD AND MICRO POWER GENERATOR FOR GENERATING ELECTRICAL POWER FROM LOW FREQUENCY VIBRATIONAL ENERGY

(75) Inventors: Haluk Kulah, Ankara (TR); Khalil Najafi, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 0 days.

(21) Appl. No.: 10/597,321

(22) PCT Filed: Jan. 21, 2005

(86) PCT No.: PCT/US2005/001974

§ 371 (c)(1),
(2), (4) Date: Mar. 19, 2007

(87) PCT Pub. No.: WO2005/069959

PCT Pub. Date: Aug. 4, 2005

(65) Prior Publication Data

US 2008/0136562 A1    Jun. 12, 2008

Related U.S. Application Data

(60) Provisional application No. 60/537,821, filed on Jan. 21, 2004.

(51) Int. Cl.
*H01L 41/113* (2006.01)
(52) U.S. Cl. .................................. 310/339
(58) Field of Classification Search ............ 310/339
See application file for complete search history.

(56) References Cited

U.S. PATENT DOCUMENTS 5,814,921 A * 9/1998 Carroll ...................... 310/339

(Continued)

FOREIGN PATENT DOCUMENTS

WO    WO 03041181    5/2003

OTHER PUBLICATIONS

Lee, D.G., et al., Novel Micro Vibration Energy Harvesting Device Using Frequency UP Conversion, Transducers & Eurosensors 2007, The 14th International Conference on Solid-State Sensors and Microsystems, Lyon France, Jun. 10-14, 2007, pp. 871-874.

(Continued)

*Primary Examiner*—Thomas M Dougherty
(74) *Attorney, Agent, or Firm*—Brooks Kushman P.C.

(57) ABSTRACT

A method and a micro power generator for generating electrical power from low frequency, vibrational energy includes a frequency up-conversion process. The generator is preferably an electromagnetic, vibration-to-electrical power generator which can efficiently scavenge energy from low frequency external vibrations. The generator up-converts low frequency environmental vibrations to a much higher frequency through a mechanical frequency up-converter, and hence provides efficient energy conversion even at low frequencies. This mechanical frequency up-conversion process can be realized in a number of ways. A magnetic method is described as an example. After frequency up-conversion, voltage is induced on coils mounted on resonators by electromagnetic induction. Due to the movement of the coils on their respective resonating cantilevers with respect to the magnet, voltage is generated on the coils and energy conversion is realized.

15 Claims, 6 Drawing Sheets

U.S. PATENT DOCUMENTS

| | | | |
|---|---|---|---|
| 2002/0172060 A1* | 11/2002 | Takeuchi | 363/110 |
| 2003/0197448 A1* | 10/2003 | Tanielian | 310/328 |
| 2004/0007942 A1* | 1/2004 | Nishida et al. | 310/314 |
| 2004/0075363 A1* | 4/2004 | Malkin et al. | 310/321 |
| 2004/0135554 A1 | 7/2004 | Clingman | |

OTHER PUBLICATIONS

Chung, Tien-Kan, et al., Design, Simulation, And Fabrication of A Novel Vibration-Based Magnetic Energy Harvesting Device, The 14th International Conference on Solid-State Sensors and Microsystems, Lyon France, Jun. 10-14, 2007, pp. 867-870.

Koeneman, Paul B., et al., Feasibility of Micro Power Supplies For MEMS, Journal of Microelectromechanical Systems, vol. 6, No. 4, Dec. 1997, pp. 355-362.

Mizuno, Makoto, et al., Investigation of a Resonance Microgenerator, Institute of Physics Publishing, Journal of Micromechanics and Microengineering, vol. 13, 2003, pp. 209-216.

Meninger, Scott, et al., Vibration-to-Electric Energy Conversion, IEEE Transactions on Very Large Scale Integration (VLSI) Systems, vol. 9, No. 1, Feb. 2001, pp. 64-76.

Williams, C.B., et al., Analysis of a Micro-Electric Generator For Microsystems, Sensors and Actuators A, vol. 52, 1996, pp. 8-11.

Williams, C.B., et al., Feasibility Study of a Vibration Powered Micro-Electric Generator, IEEE Colloquium on Compact Power Sources, May 1996, pp. 7/1-7/3.

Amirtharajah, Rajeevan, et al., A Micropower Programmable DSP Powered Using A MEMS-based Vibration-to-Electric Energy Converter, Digest of Technical Papers ISSCC 2000, Feb. 2000, pp. 362-363.

Meninger, Scott, et al., Vibration-to-Electric Energy Conversion, IEEE International Symposium on Low Power Electronics and Design, Aug. 1999, pp. 45-53.

Amirtharajah, Rajeevan, et al., Self-Powered Signal Processing Using Vibration-Based Power Generation, IEEE Journal of Solid-State Circuits, vol. 33, No. 5, 1998, pp. 687-695.

Amirtharajah, Rajeevan, et al., Self-Powered Low Power Signal Processing, IEEE Symposium on VLSI Circuits, 1997, pp. 25-26.

Kelly, S.G., Fundamentals of Mechanical Vibrations, Chapter 3, McGraw-Hill, 1997.

Hosaka, Hiroshi, et al., Evaluation of Energy Dissipation Mechanisms In Vibrational Microactuators, MEMS 1994, 1994, pp. 193-198.

* cited by examiner $f_1 > f_2$

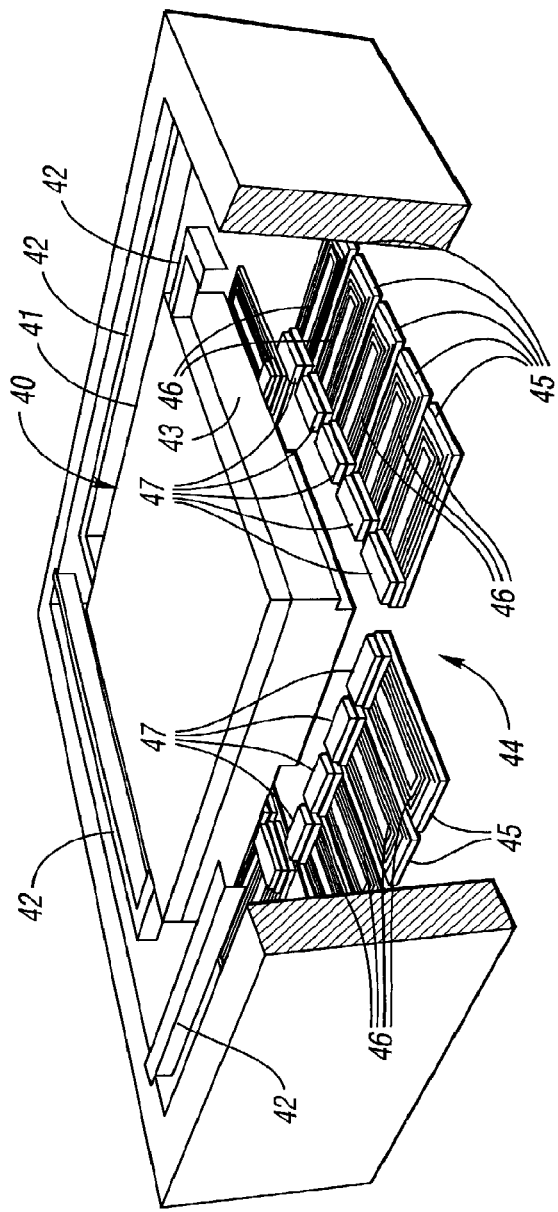
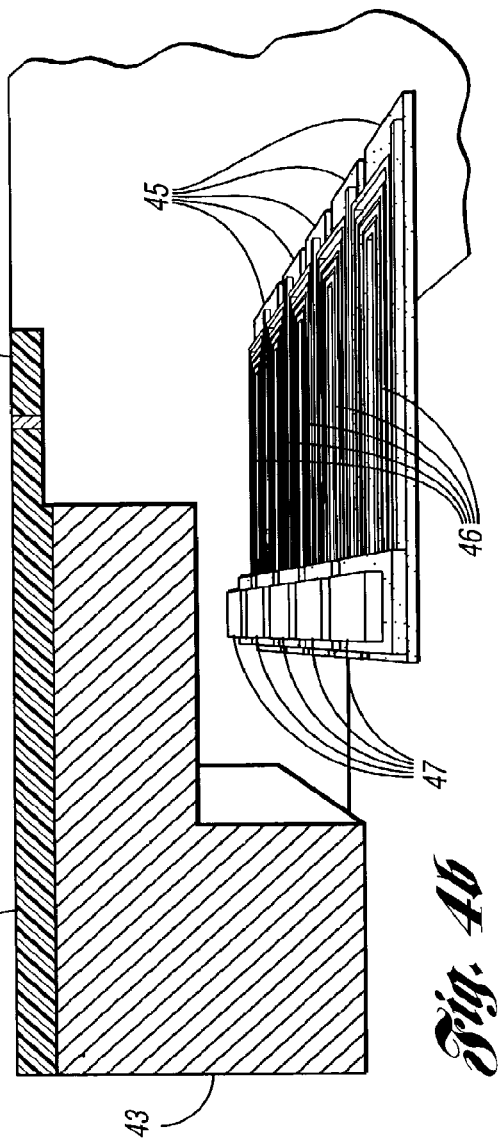

METHOD AND MICRO POWER GENERATOR FOR GENERATING ELECTRICAL POWER FROM LOW FREQUENCY VIBRATIONAL ENERGY

CROSS-REFERENCE TO RELATED APPLICATION

This application claims the benefit of U.S. provisional application Ser. No. 60/537,821, filed Jan. 21, 2004 and entitled "Electromagnetic Micro Power Generator for Low Frequency Environmental Vibrations by Using Mechanical Frequency Up-Conversion."

STATEMENT REGARDING FEDERALLY SPONSORED RESEARCH OR DEVELOPMENT

This invention was made with Government support from the National Science Foundation under NSF Grant No. EEC 9986866. The Government has certain rights in the invention.

BACKGROUND OF THE INVENTION

1. Field of the Invention

This invention relates to methods and micro power generators for generating electrical power from low frequency vibrational energy.

2. Background Art

The following references are referenced herein:

[1] B. Koenaman et al., "Feasibility of Micro Power Supplies for MEMS," JMEMS, Vol. 6, No. 4, pp. 355-362, December 1997.

[2] M. Mizuno et al, "Investigation of a Resonance Microgenerator," J. OF MICROMECH. MICROENG., Vol 13, pp. 209-216, 2003.

[3] S. Meninger et al. "Vibration-to-electric Energy Conversion," IEEE TRANS. ON VLSI SYSTEMS, Vol. 9, No. 1, pp. 64-76, 2001.

[4] C. B. Williams et al., "Analysis of a Micro-electric Generator for Microsystems," SENS. AND ACTUATORS A, Vol. 52, pp. 8-11, 1996.

[5] C. B. Williams, R. C. Woods, and R. B. Yates, "Feasibility Study of a Vibration Powered Micro-electric Generator," IEEE COLLOQUIUM ON COMPACT POWER SOURCES, pp. 7/1-7/3, May 1996.

[6] R. Amirtharajah, S. Meninger, J. O. Mur-Miranda, A. Chandrakasan, J. Lang, "A Micropower Programmable Dsp Powered Using a MEMS-based Vibration-to-electric Energy Converter," DIGEST OF TECHNICAL PAPERS ISSCC 2000, pp. 362-363, February 2000.

[7] S. Meninger, J. O. Mur-Miranda, R. Amirtharajah, A. Chandrakasan, J. Lang, "Vibration-to-electric Energy Converter," IEEE INTERNATIONAL SYMPOSIUM ON LOW POWER ELECTRONICS AND DESIGN, pp. 48-53, August 1999.

[8] R. Amirtharajah, A. P. Chandrakasan, "Self-powered Signal Processing Using Vibration-based Power Generation," IEEE JOURNAL OF SOLID-STATE CIRCUITS, Vol. 33, No. 5, pp. 687-695, 1998.

[9] R. Amirtharajah, A. P. Chandrakasan, "Self-powered Low Power Signal Processing," IEEE SYMPOSIUM ON VLSI CIRCUITS, pp. 25-26, 1997.

[10] S. G. Kelly, "Fundamentals of Mechanical Vibrations," Chapter 3, McGraw-Hill, 1997.

[11] H. Hosaka et al., "Evaluation of Energy Dissipation Mechanism in Vibrational Microactuators," MEMS '94, pp. 193-198, 1994.

Self-powered remote controlled microsystems are needed in many emerging applications including environmental monitoring and military applications. The required power for these systems can be generated mainly in two ways: 1) by using electrochemical batteries and micro fuel cells; and 2) by energy scavenging from environmental sources such as ambient heat, light, and vibration. Although electrochemical batteries and micro-fuel cells can provide more power, they are not desirable for some applications due to chemicals and reactions involved during the generation process. Also, they have a limited life time.

Energy scavenging from ambient sources has become popular recently, because of its clean power generation process and long life-time.

Among the other environmental energy scavenging sources, vibration is particularly attractive because of its abundance, and several scavenging techniques based on piezoelectric, electrostatic and electromagnetic transduction have been reported [1-9]. The maximum voltage and generated electrical power from a vibrating mass is strongly dependent on the external vibration frequency [4], and drops dramatically at low frequencies (1-10 Hz). But it is at these low frequencies where most ambient vibration exists. FIG. 1 shows the maximum power from an electromagnetic generator vs vibration frequency. In FIG. 1, it is assumed that the applied external vibration matches the generator resonance frequency. Most reported devices are only capable of operating at frequencies of several kHz; at lower frequencies they are ineffective.

Published U.S. patent application 2004/0007942 discloses an integrated MEMS resonant generator system including a plurality of piezoelectric microgenerators which generate a voltage in response to vibrational energy.

Consequently, there is a need for a method and micro power generator for converting vibrational energy having an ambient, relatively low frequency to electrical power.

SUMMARY OF THE INVENTION

An object of the present invention is to provide a method and micro power generator for generating electrical power from low frequency vibrational energy.

In carrying out the above object and other objects of the present invention, a method for generating electrical power from low frequency, vibrational energy is provided. The method includes receiving vibrational energy having a low frequency. The method further includes converting the low frequency, vibrational energy to vibrational energy having a high frequency greater than the low frequency, and converting the high frequency, vibrational energy to electrical power.

The step of converting the high frequency, vibrational energy may be performed electromagnetically, piezoelectrically or electrostatically.

The low frequency may be in the range of 1 to 100 Hz, or may be in the range of 1 to 10 Hz.

The step of converting the low frequency, vibrational energy may be performed mechanically.

The step of receiving the low frequency, vibrational energy may include the step of providing a micromechanical first resonator device, the first resonator device resonating in response to the received vibrational energy.

The first resonator device may have a mechanical resonance frequency in the range of 1 to 100 Hz.

The step of converting the low frequency, vibrational energy may include the step of providing a micromechanical second resonator device. The second resonator device may resonate at the high frequency in response to the resonating first resonator device.

The second resonator device may have a mechanical resonance frequency in the range of 1 to 10 kHz.

The second resonator device may include an array of micromechanical resonators.

Further in carrying out the above object and other objects of the present invention, a micro power generator for generating electrical power from low frequency, vibrational energy is provided. The generator includes means for receiving vibrational energy having a low frequency. The generator further includes means for converting the low frequency, vibrational energy to vibrational energy having a high frequency greater than the low frequency, and means for converting the high frequency, vibrational energy to electrical power.

Still further in carrying out the above object and other objects of the present invention, a micro power generator for generating electrical power from low frequency, vibrational energy is provided. The generator includes a micromechanical first resonator device which resonates in response to the vibrational energy. The generator further includes a micromechanical second resonator device, and a circuit coupled to the resonator devices for coupling the resonator devices together so that the second resonator device resonates at a high frequency greater than the low frequency when the first resonator resonates. The circuit also converts the high frequency, vibrational energy to electrical power.

The high frequency, vibrational energy may be converted electromagnetically.

The low frequency may be in the range of 1 to 100 Hz, or may be in the range of 1 to 10 Hz.

The conversion of the low frequency, vibrational energy may be performed mechanically.

The circuit may include a magnet and at least one coil which moves relative to the magnet. Voltage may be induced on the at least one coil by electromagnetic induction.

The first resonator device may have a mechanical resonance frequency in the range of 1 to 100 Hz.

At least one of the magnet and the at least one coil may be mechanically coupled to the devices so that the magnet and the at least one coil move relative to one another to generate voltage on the coil.

The second resonator device may have a mechanical resonance frequency in the range of 1 to 10 kHz.

The second resonator device may include an array of micromechanical resonators wherein each of the resonators has a coil formed thereon.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 4a-4c illustrates the proposed micro-generator structure; FIG. 4a is a schematic perspective view, partially broken away, to show a suspended magnet and cantilevers having coils formed thereon; FIG. 4b is an enlarged sectional view which shows metal mounted on the distal ends of the cantilevers for actuation by the magnet; FIG. 4c is a sectional view of a microgenerator formed on a pair of semiconductor chips which have been joined together;

DETAILED DESCRIPTION OF THE PREFERRED EMBODIMENTS

Figure 1:
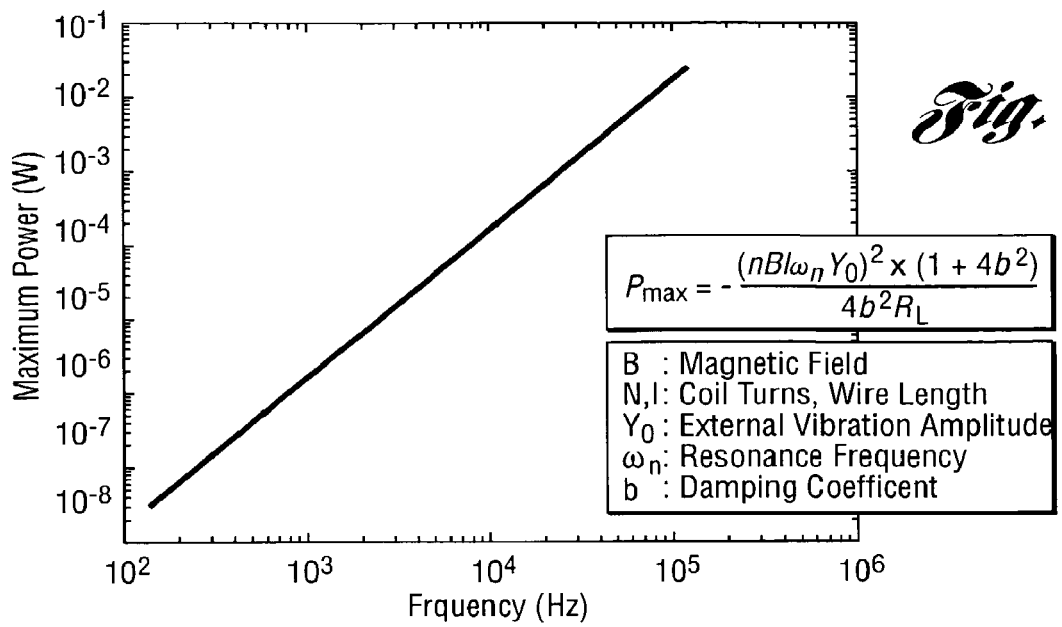
FIG. 1 is a graph of maximum electrical power versus frequency for an electromagnetic generator operating at different vibration frequencies.
Figure 2A:
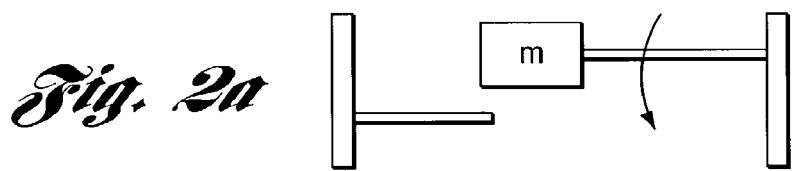
FIGS. 2a-2c are schematic views of a mass mounted on one beam which vibrates at a relatively low frequency which moves another beam to vibrate at a relatively high frequency to realize mechanical frequency up-conversion.
Figure 2B:
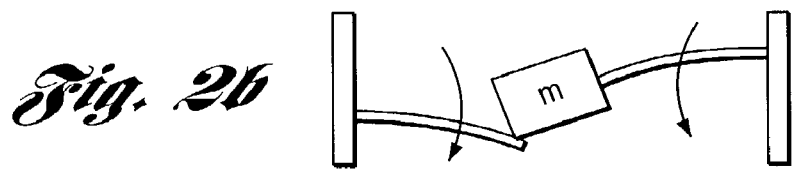
Figure 2C:
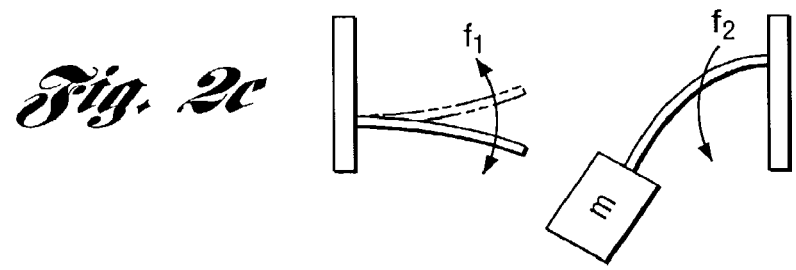

One of the main ideas for the power generation method and generator presented herein is mechanical frequency up-conversion. This mechanical up-conversion can be done in several different ways. One simple method to implement this is to use two cantilevers across each other as shown in FIG. 2(a). The cantilever on the right has a mass on the tip, and its resonance frequency is adjusted for the target ambient vibration frequency ($f_2$=1-100 Hz). As this cantilever resonates with environmental vibration, at some point of its trajectory it touches or engages the cantilever on the left and forces it to move from its stationery position (FIG. 2b). When the right cantilever disengages the left cantilever, the right cantilever continues on with its movement, but at this time the left cantilever starts to resonate at its resonance frequency ($f_1$), which is designed to be much higher than $f_2$ (FIG. 2c). This happens again and again at each cycle of the right cantilever. For each cycle of the right cantilever, the left cantilever makes $f_1/f_2$ cycles, and hence mechanical frequency up-conversion is realized. The distance between the two cantilevers and their overlap area during the contact time are important design parameters for its operation.

Figure 3:
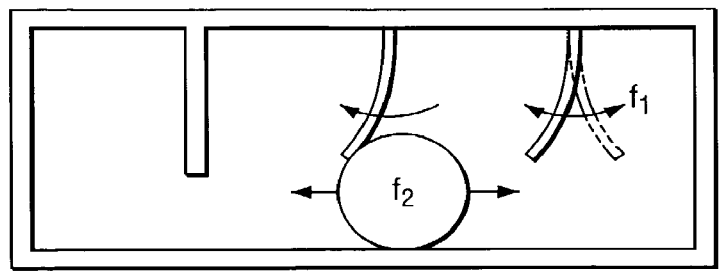
FIG. 3 is a schematic view of a ball-and-cantilever approach for frequency up-conversion.

FIG. 3 shows another approach to achieve mechanical frequency up-conversion. In this case a ball (or a cylinder) moves or rolls inside a cabinet with environmental vibration. A set of cantilevers are placed in the same cabinet, and the ball's movement is confined in an area such that it will touch the cantilevers at their tips with a pre-designed overlapping. When there is a contact between the ball and the tip of a cantilever, the cantilever is forced to move from its stationary position. As the ball passes across it, the cantilever starts resonating in its resonance frequency, which is designed as a much higher frequency than the ambient vibration. The beauty of this implementation is that, the ball can move at any ambient vibration. In other words, it is not resonating at one specific ambient frequency which is the case for the system shown in FIGS. 2a-2c.

Both of these approaches are similar to the operational principle of music boxes where different tunes are created by frequency up-conversion. Cylindrical music boxes include a wind-up spring, a metal musical "comb" with a number of notes, and a cylinder with projections on it's surface. As the cylinder rotates the projections lift and release a variety of the tuned comb teeth to produce a song. During this process, the wound spring rotates the cylinder with a low frequency $f_1$, and this frequency is up-converted by means of the projections and the comb teeth.

Figure 4C:
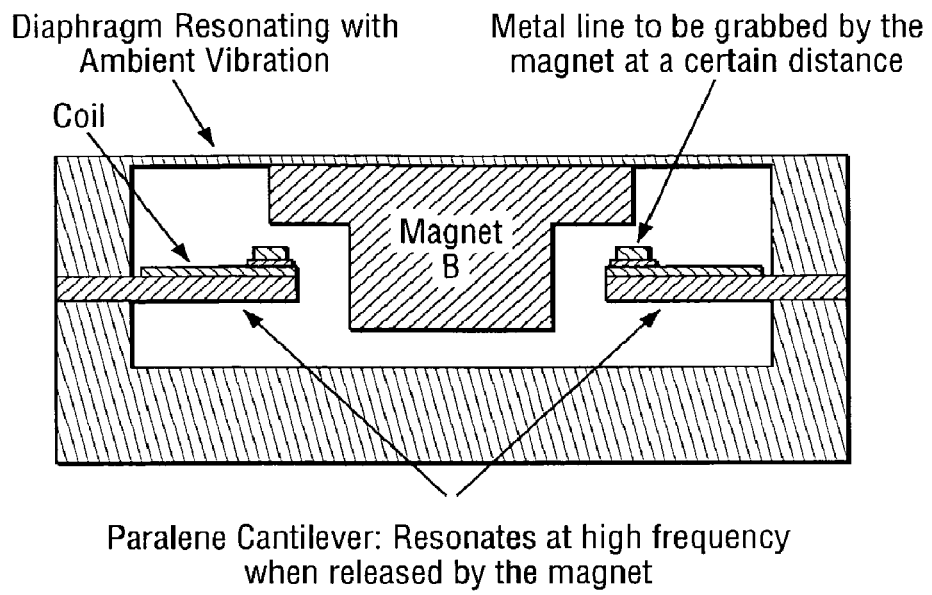

Another method to realize mechanical frequency transfer is to use a magnet. Due to its simplicity and MEMS compatibility, this is a preferred technique for use in the micro power generator. FIGS. 4a-4c are various views of the proposed system, which has two resonating devices or structures. The upper resonator structure, generally indicated at 40, includes a diaphragm 41 suspended with a soft spring (i.e., diaphragm beams 42) and has a low resonance frequency that is adjusted for the target application (1-100 Hz). It carries a magnet 43 such as an NdFeB permanent magnet 43 for both mechanical frequency up-conversion and electromagnetic power generation. The lower resonator structure, generally indicated at 44, includes a cantilever beam (or array of beams 45 as shown in FIG. 4b) which has a higher resonance frequency, and supports one or more coils 46 for electromagnetic power generation, and a magnetic tip 47 that is attracted to the magnet 43 when in close proximity to the magnet 43. As the diaphragm 41 resonates in response to external vibration, it gets closer to the cantilever(s) 45 located beneath it. The distance between them is adjusted such that the magnet 43 catches the cantilever(s) 45 at a certain point of its movement, pulls it (them) up and releases at another point. The released cantilever(s) 45 starts resonating at its/their mechanical resonance frequency which may be set to 1-10 kHz, and hence mechanical frequency conversion is realized.

Figure 5:
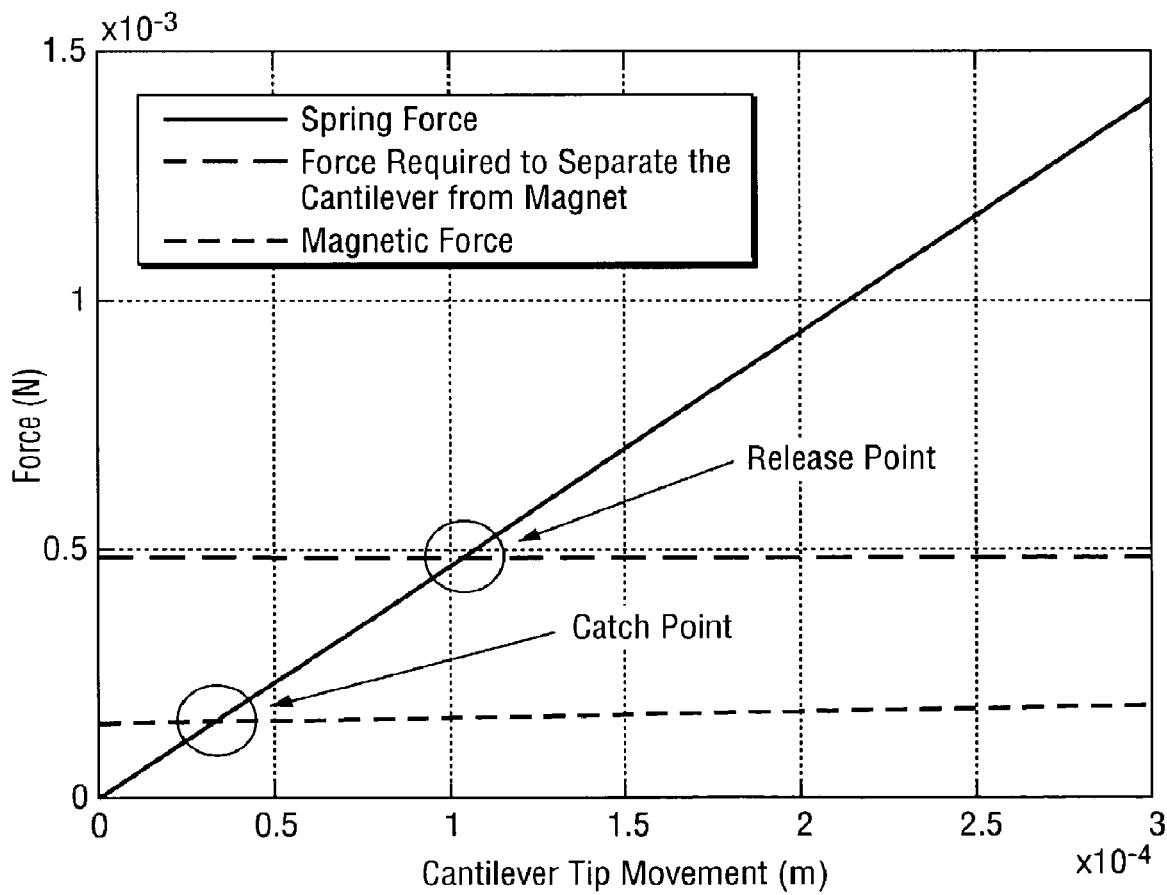
FIG. 5 is a graph of force versus cantilever tip movement which illustrates the forces effective on the cantilever movement showing the catch and release points.
Figure 6A:
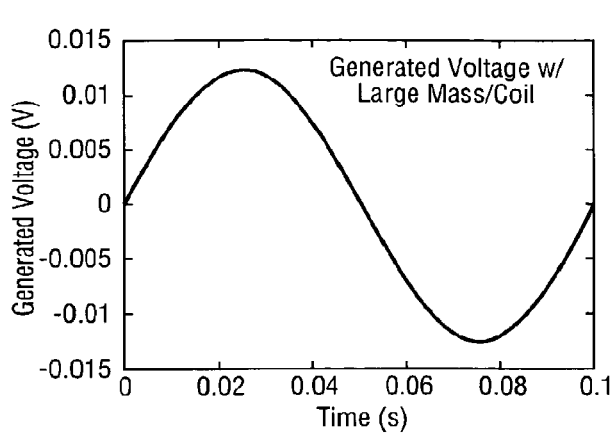
FIGS. 6a and 6c are graphs of generated voltage versus time and FIGS. 6b and 6d are graphs of instantaneous power versus time; these graphs illustrate the comparison of emf and generated power values for large mass/coil and frequency up-conversion.
Figure 6B:
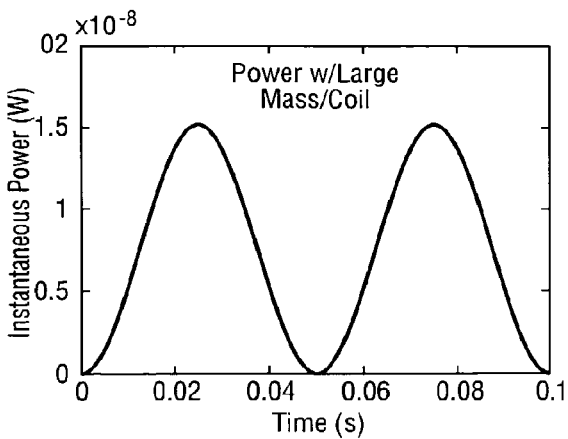
Figure 6C:
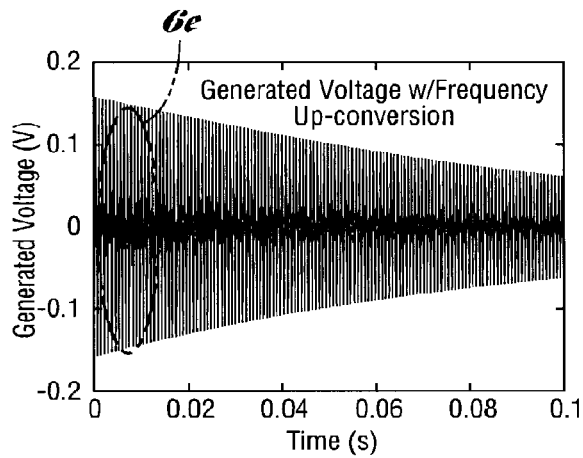
Figure 6D:
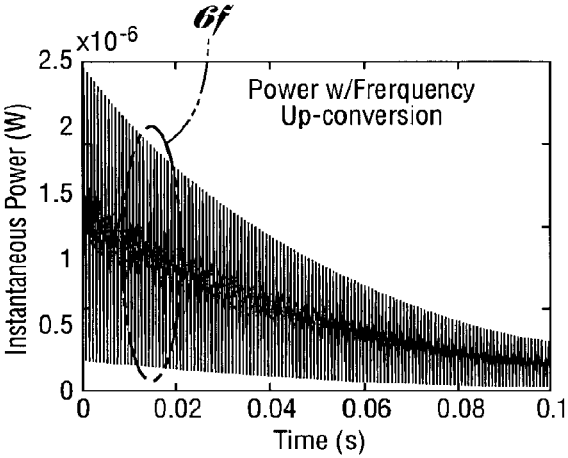
Figure 6E:
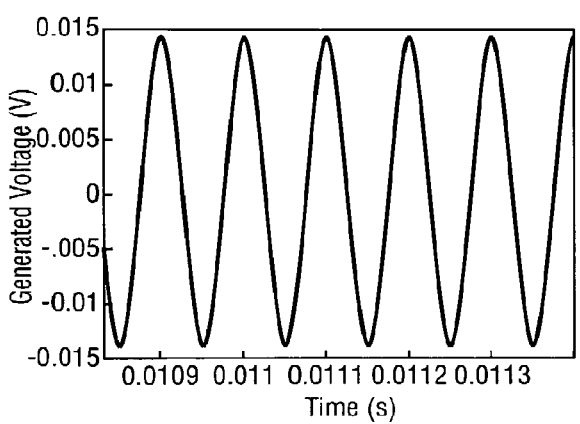
FIGS. 6e and 6f are enlarged portions of the graphs of FIGS. 6c and 6d, respectively.
Figure 6F:
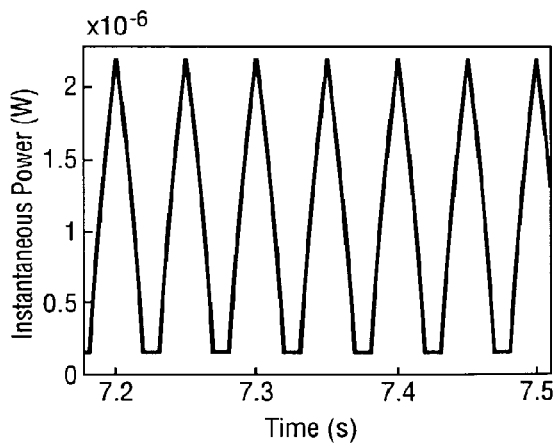

One of the most important aspects of the design of FIGS. 4a-4c is the adjustment of magnet catch and release points. The magnetic force generated by the magnet 43 and the mechanical spring force of the cantilever(s) 45 have been modeled using MATLAB. FIG. 5 shows these two forces vs. tip movement distance, indicating the catch and release points of the magnet 43. In order to decrease damping and maximize generated power, the device can be operated in vacuum.

Although this approach reduces the coil size and beam deflection, energy conversion is more efficient than when a similar sized magnet 43 resonates at low frequency above a large area coil (due to higher resonance frequency and speed of the beam). FIGS. 6a-6f show expected voltage and power generated by a high frequency resonant beam in vacuum compared to a low frequency resonating mass/coil. As these figures show, the generated voltage and power are improved by 10 and 100 times, respectively.

One of the main advantages of the present invention is the mechanical frequency up-conversion by means of the magnet, which can increase the power transfer efficiency. Operating the system in vacuum increases the decay time in generated voltage and power, and hence allows high ratios in mechanical frequency up-conversion. In other words, there is a trade-off between the damping ratio and the mechanical frequency conversion coefficient.

Simulations

As previously mentioned, the overall system has been modeled in MATLAB for calculation of generated voltage, power, catch and release points, and damping coefficient. To provide comparison, a large magnetic mass resonating on top of a single coil is also simulated. Table 1 shows the parameters for the simulation.

TABLE 1

Simulation Parameters

| Parameter | Frequency Up-Conversion | Large Mass/Coil |
|---|---|---|
| Resonance Frequency | 11.4 kHz | 25 Hz |
| Coil Area | 400 × 300 µm² | 5 × 5 mm² |
| Coil Turns | 37 | 50 |
| Magnet Material | NdFeB (1.1 T) | NdFeB (1.1 T) |
| Magnet Size | 2 × 2 × 1 mm³ | 2 × 2 × 1 mm³ |
| Environment | Vacuum | Vacuum |

The induced voltage on a coil by means of a vibrating magnet at resonance can be represented as [2]:

$$V_{em} = \frac{Bl_p \omega_n Y_0}{2\gamma} \sqrt{1+4\gamma^2} \sin(\omega_n t - \Delta)$$

where $l_p$ is the practical coil length (approximately n×l, n: number of coil turns, l: coil length across the magnetic flux), B is the magnetic field, $Y_0$ is the ambient vibration amplitude, $\gamma$ is the damping coefficient, $\Delta$ is the phase difference, and $\omega_n$ is the resonance frequency.

For frequency up-conversion technique the situation is slightly different due to the forced motion of the cantilever. By using the equation of motion for a damped vibrating system with initial condition [10], the electromagnetically induced voltage on the cantilever coil can be expressed as:

$$V_{em} = \frac{l_p B x_0}{\sqrt{1-\gamma^2}} e^{-\gamma \omega_n t} \omega_n \left( \gamma \sin(\omega_d t) + \sqrt{1-\gamma^2} \cos(\omega_d t) \right)$$

where $\omega_d$ is the damped resonance frequency and $x_o$ is the initial displacement (the release point). Note that the voltage has an exponential dependence on time.

Maximum power can be calculated using these equations. As previously mentioned, FIGS. 6a-6f show the generated power from a low frequency resonating mass/coil and a high frequency resonant beam in vacuum. As the figure shows, maximum power generated by the frequency up-conversion technique is two orders of magnitude larger than the large mass/coil case.

Although the power decreases exponentially in time, the rate of decrease can be controlled by controlling the damping. There are two types of damping for the beams: mechanical and electrical. Mechanical damping is composed of four main components [11] (airflow force, squeeze force, internal friction and support loss), and can be expressed as:

$$\gamma_m = \frac{3\pi\mu b + (3/4)\pi\mu b^2 \sqrt{2\rho_a \mu \omega}}{2\rho_b h b^2 \omega} + \frac{\eta}{2} + \frac{0.23 h^3}{l^3} + \frac{\mu b^2}{2\rho_b g_0^3 h \omega}$$

where $\rho_a$ is the mass density of air, $\rho_b$ is the mass density of the cantilever, $\mu$ is viscosity, $\omega$ is the vibration frequency, b is the width of the cantilever, l is the cantilever length, h is the thickness of the cantilever, $\eta$ is the structural damping factor and $g_0$ is the distance between cantilevers.

Electrical damping depends on inductive coil properties and the electrical load, and can be expressed as:

$$\gamma_e = \frac{(Bl_p)^2}{2\omega_n m R_0}$$

where m is the cantilever mass, $\omega_n$ is the resonance frequency, and $R_0$ is the load resistance. Damping factor decreases considerably in vacuum. Besides vacuum operation, lower rate frequency up-conversion and larger number of cantilevers help to maximize the average power.

As previously mentioned, one of the most important parts of this design is the adjustment of magnet catch and release points. The catch point is the location of the cantilever at which the magnetic force effective on it is larger than the spring force, i.e.:

$$F_s < F_m, \quad kx < \frac{B^2 A_m}{8\pi \times 10^{-7}}$$

where k is the spring constant, $A_m$ is the cantilever area for magnetic attraction, and B is the magnetic field expressed as:

$$B = \frac{B_r}{\pi}\left(\operatorname{atan}\left(\frac{a_1 a_2}{2z\sqrt{a_1^2 + a_2^2 + 4z^2}}\right) - \operatorname{atan}\left(\frac{a_1 a_2}{2(z+d)\sqrt{a_1^2 + a_2^2 + 4(z+d)^2}}\right)\right)$$

where $a_1$, $a_2$ and d are the magnet dimensions, and z is the distance from the magnet. FIG. 5 shows these two forces vs. distance, indicating the catch and release points of the magnet. For this example, the magnet catches and releases the cantilever(s) at around 30 and 100 μm distances, respectively.

The micro-generator is preferably fabricated as two separate silicon chips 70 to be combined at the end of the process. These chips 70 and 70' are fabricated on the same wafer with the identical process flow requiring 5 masks. FIGS. 7a-7i show the process flow.

First, an oxide layer (71 and 71') is formed on the silicon substrates 70 and 70', respectively. This layer (71 and 71') provides isolation between metal bond pads and the silicon substrates 70 and 70'.

Figure 7A:
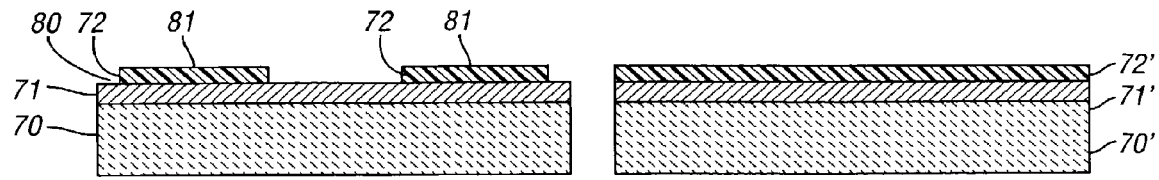
FIGS. 7a-7i are cross-sectional views which illustrate the fabrication process for the micro-generator.

Next, a 5 μm-thick parylene layer (72 and 72') is deposited and patterned at the bonding pad and cantilever areas 80 and 81, respectively (FIG. 7a).

Figure 7B:
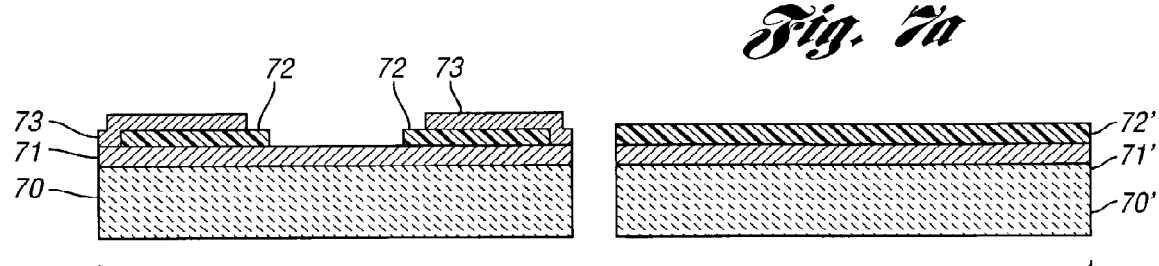

Then, coils (i.e., inductors) are formed by sputtering and patterning the first metal layer 73 (FIG. 7b).

Figure 7C:
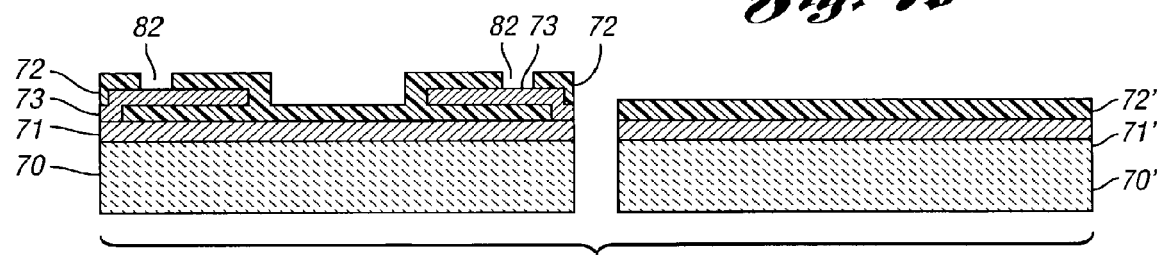

As the next step, a second 5 μm-thick parylene layer (also 72) is formed on the metal and patterned at the contact areas 82 between two metal layers (FIG. 7c). This parylene layer 72 provides isolation between the two metal layers.

Figure 7D:
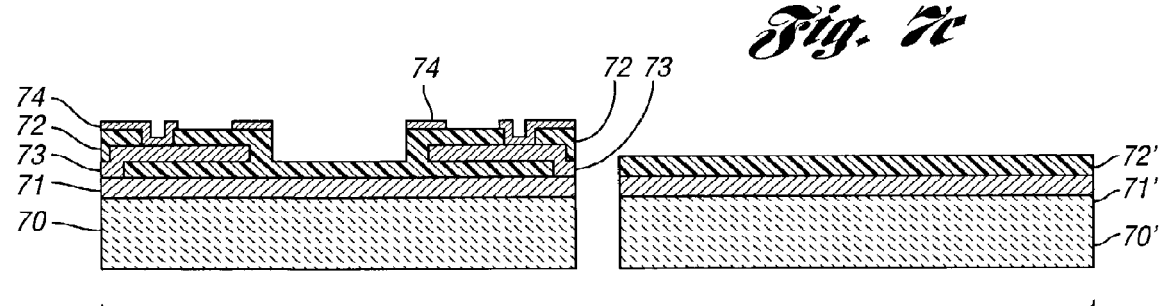

Then, the second metal layer 74 is formed by using a ferromagnetic material such as nickel (FIG. 7d). This metal is used for both magnetic actuation and electrical routing purposes.

Figure 7E:
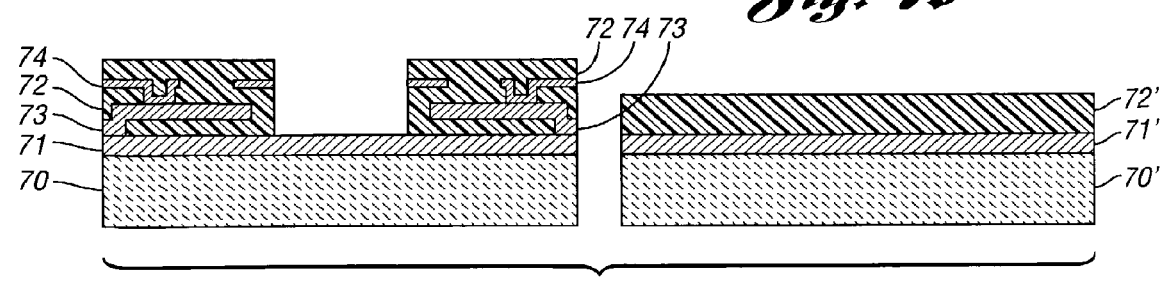

After forming the second metal layer, another parylene layer (also 72 and 72') is deposited to increase the thickness and adjust the resonant frequency of the cantilevers (FIG. 7e).

Figure 7F:
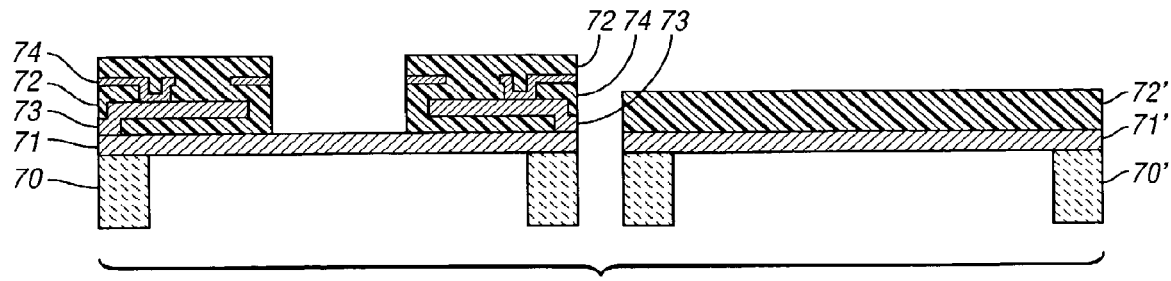

Next, the silicon substrate 70 and 70' is etched from backside by DRIE to define diaphragm and cantilever areas (FIG. 7f).

Figure 7G:
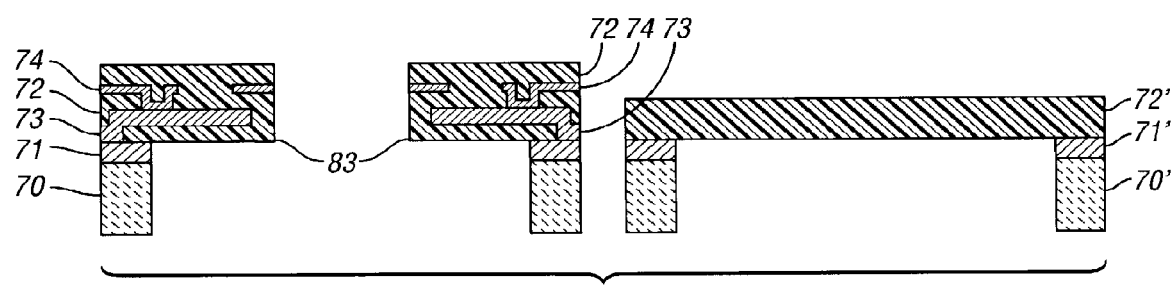

By etching the sacrificial oxide, the devices are released and the two separate chips are obtained with cantilevers 83 (FIG. 7g).

Figure 7H:
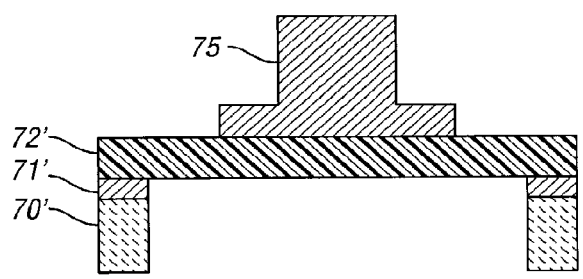

Before combining the two chips, a magnet 75 is placed on top of the parylene diaphragm 72' of the second chip by means of a micro manipulator (FIG. 7h).

Figure 7I:
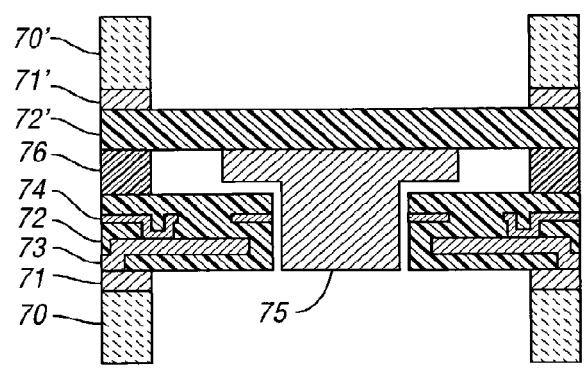

Finally, the two chips are combined or joined with a spacer or separator 76 therebetween (FIG. 7i). This separator can be made of either silicon or plastic material for precise control of the distance between the two chips.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for generating electrical power from low frequency, vibrational energy, the method comprising:

receiving vibrational energy having a low frequency wherein the step of receiving includes the step of providing a micromechanical first resonator device, the first resonator device resonating in response to the received vibrational energy and including an element which is supported to vibrate inertially at a low frequency by inertial forces;

converting the low frequency, vibrational energy to vibrational energy having a high frequency greater than the low frequency wherein the step of converting includes the step of providing a micromechanical second resonator device, the second resonator device resonating at the high frequency greater than the low frequency in response to the resonating first resonator device wherein the second resonator device has a mechanical spring force;

generating a magnetic force between the devices wherein the magnetic force between the devices is larger than the spring force at a catch point at which the second resonator device is magnetically pulled towards the vibrating element; and converting the high frequency, vibrational energy to electrical power wherein the step of converting the high frequency, vibrational energy is performed electromagnetically.

2. The method as claimed in claim 1, wherein the low frequency is in the range of 1 to 100 Hz.

3. The method as claimed in claim 2, wherein the low frequency is in the range of 1 to 10 Hz.

4. The method as claimed in claim 1, wherein the second resonator device has a mechanical resonance frequency in the range of 1 to 10 kHz.

5. The method as claimed in claim 1, wherein the second resonator device includes an array of micromechanical resonators.

6. A micro power generator for generating electrical power from low frequency, vibrational energy, the generator comprising:

a micromechanical first resonator device which resonates in response to the vibrational energy, the first resonator device including an element which is supported to vibrate inertially at a low frequency by inertial forces;

a micromechanical second resonator device having a mechanical spring force; and a circuit including a magnet for generating a magnetic force between the devices and being mechanically coupled to the resonator devices for magnetically coupling the resonator devices together so that the second resonator device resonates at a high frequency greater than the low frequency when the first resonator device resonates wherein the magnet has catch and release points and wherein the magnetic force between the devices is larger than the spring force at the catch point at which the second resonator device is pulled towards the vibrating element, the circuit also converting the high frequency, vibrational energy to electrical power.

7. The generator as claimed in claim 6, wherein the high frequency, vibrational energy is converted electromagnetically.

8. The generator as claimed in claim 6, wherein the low frequency is in the range of 1 to 100 Hz.

9. The generator as claimed in claim 8, wherein the low frequency is in the range of 1 to 10 Hz.

10. The generator as claimed in claim 6, wherein the conversion of the low frequency, vibrational energy is performed mechanically.

11. The generator as claimed in claim 6, wherein the circuit includes at least one coil which moves relative to the magnet and wherein voltage is induced on the at least one coil by electromagnetic induction.

12. The generator as claimed in claim 11, wherein the first resonator device has a mechanical resonance frequency in the range of 1 to 100 Hz.

13. The generator as claimed in claim 11, wherein at least one of the magnet and the at least one coil is mechanically coupled to the resonator devices so that the magnet and the at least one coil move relative to one another to generate voltage on the at least one coil.

14. The generator as claimed in claim 12, wherein the second resonator device has a mechanical resonance frequency in the range of 1 to 10 kHz.

15. The generator as claimed in claim 13, wherein the second resonator device includes an array of micromechanical resonators and wherein each of the resonators has a coil formed thereon.

* * * * *

UNITED STATES PATENT AND TRADEMARK OFFICE
CERTIFICATE OF CORRECTION

PATENT NO.       : 7,579,757 B2
APPLICATION NO.  : 10/597321
DATED            : August 25, 2009
INVENTOR(S)      : Kulah et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 35 days.

Signed and Sealed this

Fourteenth Day of September, 2010

David J. Kappos
*Director of the United States Patent and Trademark Office*